United States Patent [19]

Connell et al.

[11] Patent Number: 4,982,108
[45] Date of Patent: Jan. 1, 1991

[54] LOW CURRENT CMOS TRANSLATOR CIRCUIT

[75] Inventors: Lawrence E. Connell, Naperville, Ill.; Gregg R. Lichtscheidl, Little Canada, Minn.

[73] Assignee: Motorola Inc., Schaumburg, Ill.

[21] Appl. No.: 227,589

[22] Filed: Aug. 2, 1988

[51] Int. Cl.$^5$ .................... H03L 5/00; H03K 19/094; H03K 3/01; H03K 17/687

[52] U.S. Cl. .................... 307/264; 307/451; 307/270; 307/585

[58] Field of Search ............... 307/264, 450, 451, 270, 307/443, 475, 542, 548, 448, 449, 585; 323/312, 313, 315, 316

[56] References Cited

U.S. PATENT DOCUMENTS

| | | | |
|---|---|---|---|
| 3,801,831 | 4/1974 | Dame | 307/251 |
| 3,855,549 | 12/1974 | Huener et al. | 307/451 |
| 3,922,596 | 11/1975 | Cave et al. | 323/316 |
| 4,390,802 | 6/1983 | Woltz | 307/475 |
| 4,424,456 | 1/1984 | Shiraki et al. | 307/451 |
| 4,587,497 | 5/1986 | Keller et al. | 331/116 R |
| 4,710,724 | 12/1987 | Connell et al. | 330/9 |
| 4,710,730 | 12/1987 | Doyle | 331/116 FE |
| 4,716,319 | 12/1987 | Rebeschini | 307/520 |
| 4,752,703 | 6/1988 | Lin | 307/451 |
| 4,754,170 | 6/1988 | Toda et al. | 307/264 |
| 4,783,603 | 11/1988 | Goforth et al. | 307/451 |
| 4,801,826 | 1/1989 | Cornelissen | 307/482 |

OTHER PUBLICATIONS

"BiCMOS Voltage Level Translator and Shifter Circuits", by Kevin L. McLaughlin, Motorola Technical Developments, vol. 6, Oct. 1986, pp. 28 and 29.

"High-Performance Crystal Oscillator Circuits: Theory and Application", by E. A. Vittoz, M. G. R. Degrauwe, and S. Bitz, I.E.E.E. Journal of Solid-State Circuits, vol. 23, No. 3, Jun. 1988, pp. 774-781.

"A New Digital TCXO Circuit Using a Capacitor-Switch Array", by T. Uno and Y. Shimoda, I.E.E.E. reprint CH1957-0/83, pp. 437,438.

Primary Examiner—Stanley D. Miller
Assistant Examiner—Trong Phan
Attorney, Agent, or Firm—Anthony J. Sarli; Steven G. Parmalee; Joseph P. Krause

[57] ABSTRACT

A low current CMOS translator arrangement is disclosed that utilizes a low current inverting stage, having a peak current requirement, fed by a constant current source at a supply node that also has a capacitor coupled to it. This low current inverter is useful for a number of applications, including generating a sinusoidal signal when it is coupled to a crystal. When one or more are cascaded and coupled to a square wave input signal, the arrangement becomes a low current translator that level-shifts, or translates, the input signal having a first voltage range to a translated square wave output signal having a second voltage range. In another embodiment called a low current squaring translator, a squaring stage is coupled between the low current inverter and a low current translator that includes one or more inverting stages. This arrangement is able to achieve an output signal that maintains a precise duty cycle with low noise at a very low current.

20 Claims, 3 Drawing Sheets

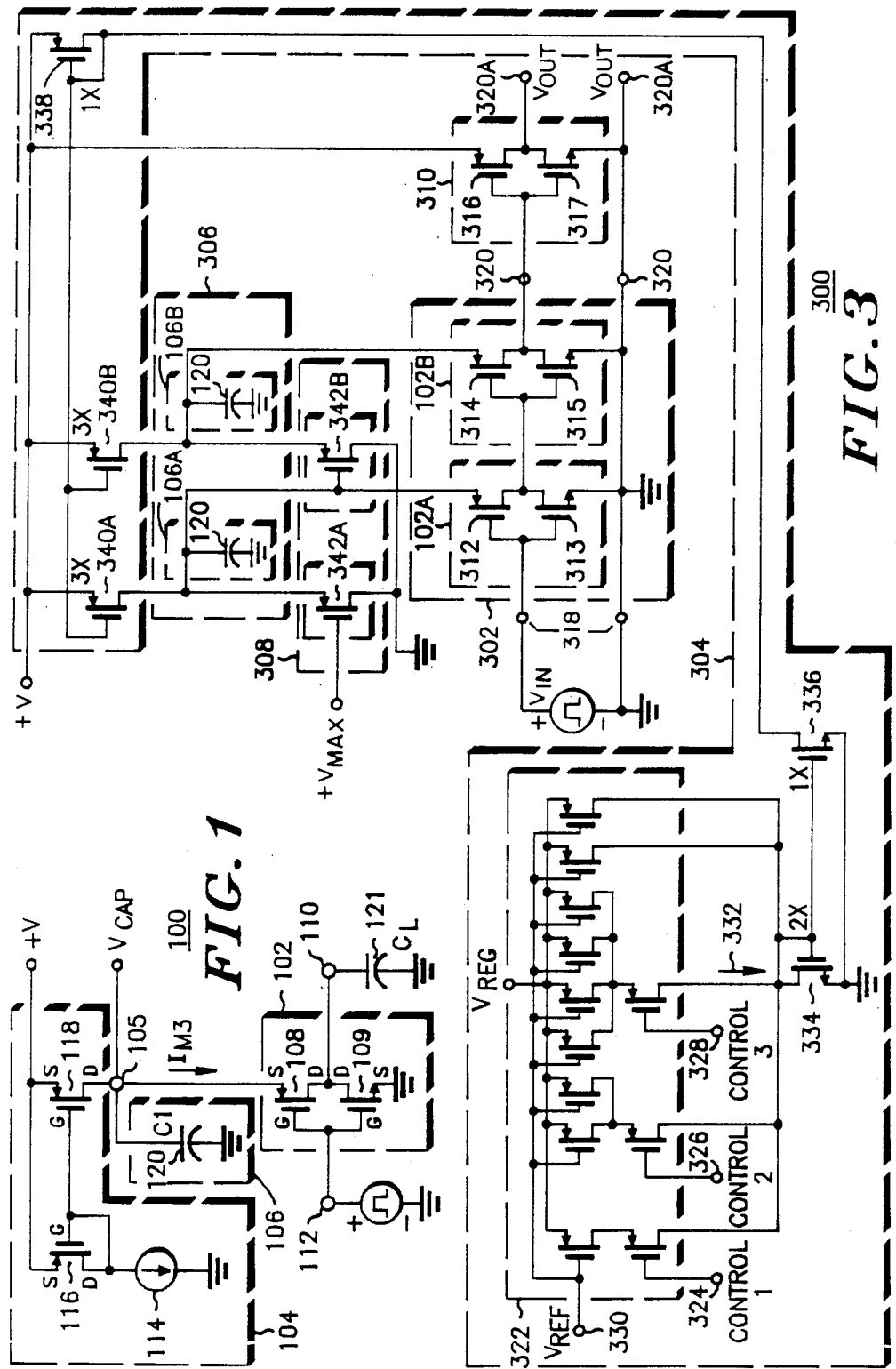

LOW CURRENT CMOS TRANSLATOR CIRCUIT

BACKGROUND OF THE INVENTION

The present invention relates generally to complementary metal oxide semiconductor (CMOS) integrated circuits for low current, signal level translation applications. More particularly, the present invention is directed to translator circuit arrangements that are useful for providing a square wave output signal with preserved duty cycle, whether the input signal is a square wave or a sinusoid. These circuits are especially useful when translating a sinusoidal signal generated in a low current inverting stage.

Signal level translation is generally defined as a shifting of a given signal having a set peak-to-peak signal amplitude to another, different peak-to-peak signal amplitude. For most digital applications, a square wave output signal is desired, even though the input signal may exist either as a square wave or as a sinewave. The square wave output signal is desireable for noise immunity and for interfacing with other digital circuitry that is commonly found in present-day radio and computer circuitry.

Various attempts have been made to provide suitable translators, but these translators have proved to be seriously deficient in one or more of the following operational characteristics, including high current consumption, poor preservation of duty cycle, and poor noise immunity.

One known type of translator relies upon an inverting stage, consisting of a complementary pair of devices, that is coupled to an input signal through a DC blocking capacitor. This inverting stage is supplied by a voltage source and includes a resistor coupled between output and input. Such a translator arrangement operates the two devices as a Class A stage and suffers from very high current consumption. Typically, the input voltage is several volts smaller than the supply voltage and consequently both devices will always be on and dissipate a large current.

Accordingly, there exists a need for a low current translator suitable for use with a high frequency (10–20 MHz) sinusoidal or square wave input signal that provides an output signal that maintains a precise duty cycle with low noise.

SUMMARY OF THE INVENTION

It is an object of the present invention to provide a low current translator arrangement that overcomes the foregoing deficiencies.

It is another object of the present invention to provide a low current translator arrangement of the foregoing type that is also readily usable with a low current inverter for providing a direct-coupled translator arrangement in which the square wave output signal has a precise duty cycle maintained with low noise, even when the input signal is sinusoidal.

Briefly described, the present invention contemplates a low current inverter arrangement in which an inverting stage, having a peak current requirement, is fed by a constant current source at a supply node that also has a capacitor coupled to it. This low current inverter is useful for a number of applications. When it is coupled to a crystal, it generates a sinusoidal signal. When one or more are cascaded and coupled to a square wave, it becomes a low current translator that translates the input signal having a first voltage range to a translated square wave output signal having a second voltage range.

In another embodiment, a squaring stage is coupled between the low current inverter and a low current translator that includes one or more inverting stages. This arrangement is able to achieve an output signal that maintains a precise duty cycle with low noise while drawing a very low current.

BRIEF DESCRIPTION OF THE DRAWINGS

FIG. 1 is a simplified schematic diagram of a low current inverter stage utilized in the present invention.

FIG. 3 is a schematic diagram of a low current, direct coupled translator circuit that is useful for translating a square wave from a first voltage range to a higher, second voltage range at the output.

DETAILED DESCRIPTION OF THE PREFERRED EMBODIMENT

Figure 2A:
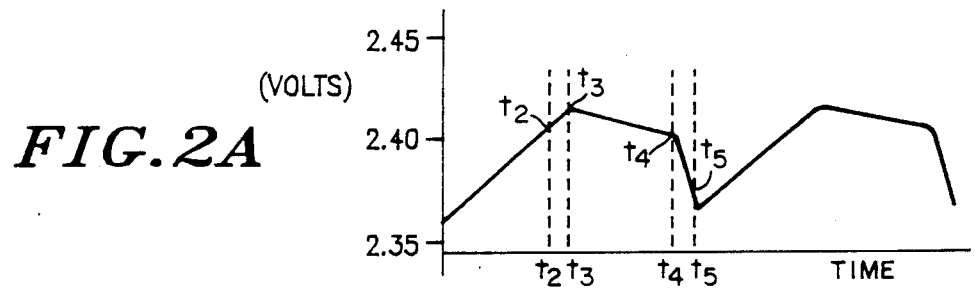
FIG. 2($a$–$d$) illustrates various currents and voltages generated at the identified points based upon input signal voltage Vin.
Figure 2B:
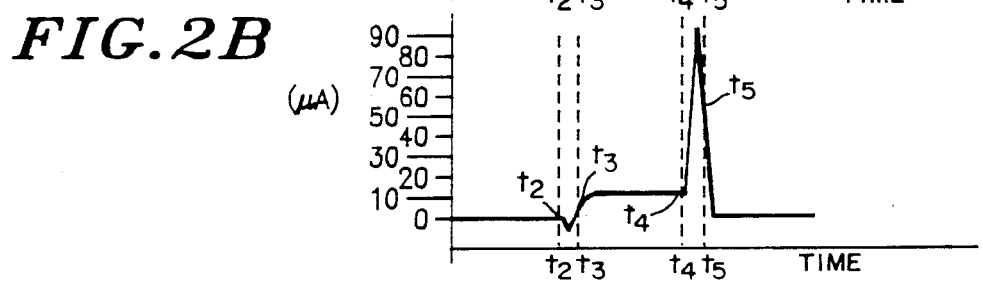
Figure 2C:
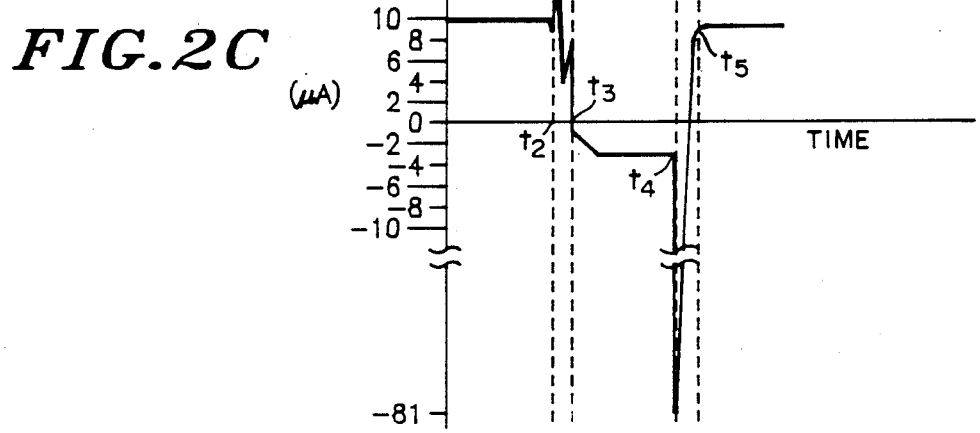
Figure 2D:
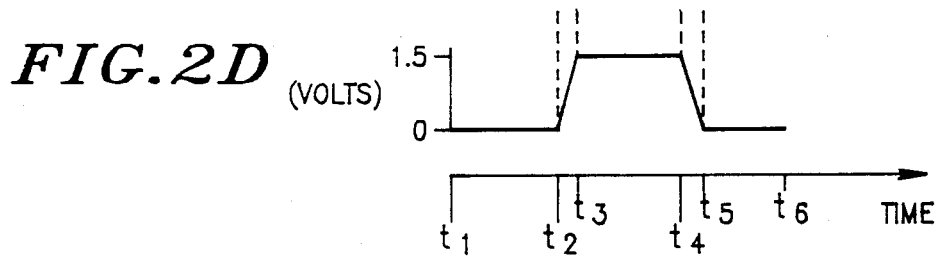

FIG. 1 illustrates at 100 a simplified schematic diagram of a low current inverter utilized in an embodiment of the present invention. As shown, the inverter includes an inverting stage (102), a current supply (104), and a capacitor (106).

The inverting stage (102) includes a pair of complementary metal-oxide-semiconductor (CMOS) devices (108, 109). Device (108) is a P-channel device, while device (109) is an N-channel device. The output is taken from 110, and the input is applied to 112, as shown.

The current supply (104) includes at least a constant current or source (114), and may include additional devices (116, 118) which act as a current mirror to ultimately feed supply node 105. The capacitor (106) includes a capacitor of about 5 picofarads (pF), as represented by C1 (labelled 120).

This inverting stage (100) is useful either for voltage translation, or, as will be described later in conjunction with FIG. 4, as an inverting gain stage to drive a load while generating a sinusoidal signal when coupled to an external crystal (not shown in FIG. 1).

FIG. 2 illustrates, at A,B,C,D, several currents and voltages developed at various identified points based upon a near rectangular input signal voltage, Vin. The circuit has three states it assumes during each cycle.

During the first state between $t_1$–$t_2$, the input signal is low and device 108 is ON, while device 109 is OFF. The voltage at node 110 is approximately equal to the value $V_{cap}$ (represented by waveform A) which appears at node 105. The capacitor (106) is being charged, along with the load capacitance, $C_L$, (121) by current source device (118), so that the voltage at supply node 105 is rising at a rate of approximately I/C1, where $C1 >> C_L$ and I is the supply, or bias, current from the current supply (104).

During the second state between $t_2$–$t_4$, the input signal goes high, causing device 109 to conduct. Device 108 will continue conducting if the bias current, I, is chosen to be greater than $I_{opt}$, where:

$$I_{opt} = C_L*(Vin_{max} + V_{t[108]})*fo$$

and:
- $C_L$ = the load capacitance,
- $Vin_{max}$ = the maximum input voltage,
- $V_{t[108]}$ = the P-channel threshold voltage for device 108, and
- fo = the operating frequency.

For lesser or equal values of current, the voltage $V_{cap}$ at node 105 will be approximately:

$$V_{cap} \approx I/(f_o*C_L),$$

where:
- I = current from the current source,
- $f_o$ = the frequency of operation, and
- $C_L$ = the load capacitance.

For values of current, I, greater than $I_{opt}$, the device 108 will act to clamp the voltage shift, $V_{sh}$, according to the equation:

$$V_{sh} = SQRT\,[I3/B] + V_t,$$

where:
- $I3 \approx 2*(I - I_{opt})$,
- $B = (W/L)(u*C_{ox}/2)$, with:
- (W/L) = the width to length ratio, of device 108
- u = the mobility of P-channel carriers,
- $C_{ox}$ = the oxide capacitance, per unit area,
- $V_t$ = the P-channel threshold voltage.

The third state occurs during the time period t4-t5. When the input signal goes low, device 109 shuts OFF and device 108 turns fully ON, allowing a large instantaneous current to flow from C1 to charge the load capacitor. This can be seen by observing when the input signal (represented by waveform D) is switched low at input 112, device 108 sources a peak current $I_{M3}$, (represented by waveform B) of about 90 microamperes (uA). Since the constant current source (104) only supplies about 10 microamperes, capacitor (106) supplies the excess current (represented by waveform C) needed to meet this peak requirement. As soon as the load capacitance is charged up to the value $V_{cap}$, the three-state cycle starts over again.

FIG. 3 depicts a low current translator at 300 that includes one or more inverting stages (302). The inverting stages (302) are supplied from a current supply (304) and each stage is coupled to a respective one of a plurality of capacitors (306). Voltage clamping stages (308) are utilized to clamp the voltage developed on each of the capacitors (306) so that a predictable upper limit for each stage is established to preserve the duty cycle associated with the input signal. The voltage clamps (308) include a P-Channel device (342A and 342B) to provide the upper limit on the voltage for each of stages 102A and 102B, respectively. The gate input of 342A is connected to a DC voltage which is approximately equal to the maximum value of the waveform applied to input port (318).

Since the addition of the voltage clamp now allows current in excess of $I_{opt}$ to be dissipated over an entire input cycle, as opposed to the ½ of a cycle for the simple inverting stage (102), the voltage shift per stage will equal $$V_{sh}' = SQRT\,(I_3/2B) + V_t$$

Here, the B term is determined by the clamp characteristics and B can now be made quite large without increasing the loading seen by the driving stage. By choosing a large W/L or B for the clamp, $V_{sh}'$ can be approximately set to $V_t$.

As shown, the inverting stages (302) include complementary pairs 312-313, 314-315. Although these two pairs are similar to stage 102 of FIG. 1 they have been labelled as 102A and 102B to indicate that they are being operated with I set slightly greater than $I_{opt}$ so that, regardless of input signal level variations and mismatch between stages, each one develops a level shift comparable to one P-channel threshold, $V_t$, equal to about 0.75 volts. Note in this example that stage 310 is acting as a buffer stage where the input signal at input port (318) has already been shifted at the output port (320) by 102A and 102B to within one P-channel threshold, $V_t$, of the output supply voltage.

Current supply (304) is programmable (322) via control leads (324,326,328) to select an amount of current based upon an operating frequency range of 10-20 MHz and a variation in reference current of 1-2.6 uA. Node 330 is coupled to a reference voltage, $V_{ref}$. The current is then mirrored via current mirrors (334, 336, 338, 340A and 340B) having the multipliers shown, yielding 3-13.5 uA to 102A and 102B. For a 50% duty cycle input waveform, which is processed through six 102 type stages, the output waveform will exhibit a duty cycle within at least 45%-55%. High frequency voltage translation is accomplished at minimal current since the current required per stage is basically only that needed to charge a small load capacitance associated with minimally sized devices which are used in the inverting stages.

Figure 4:
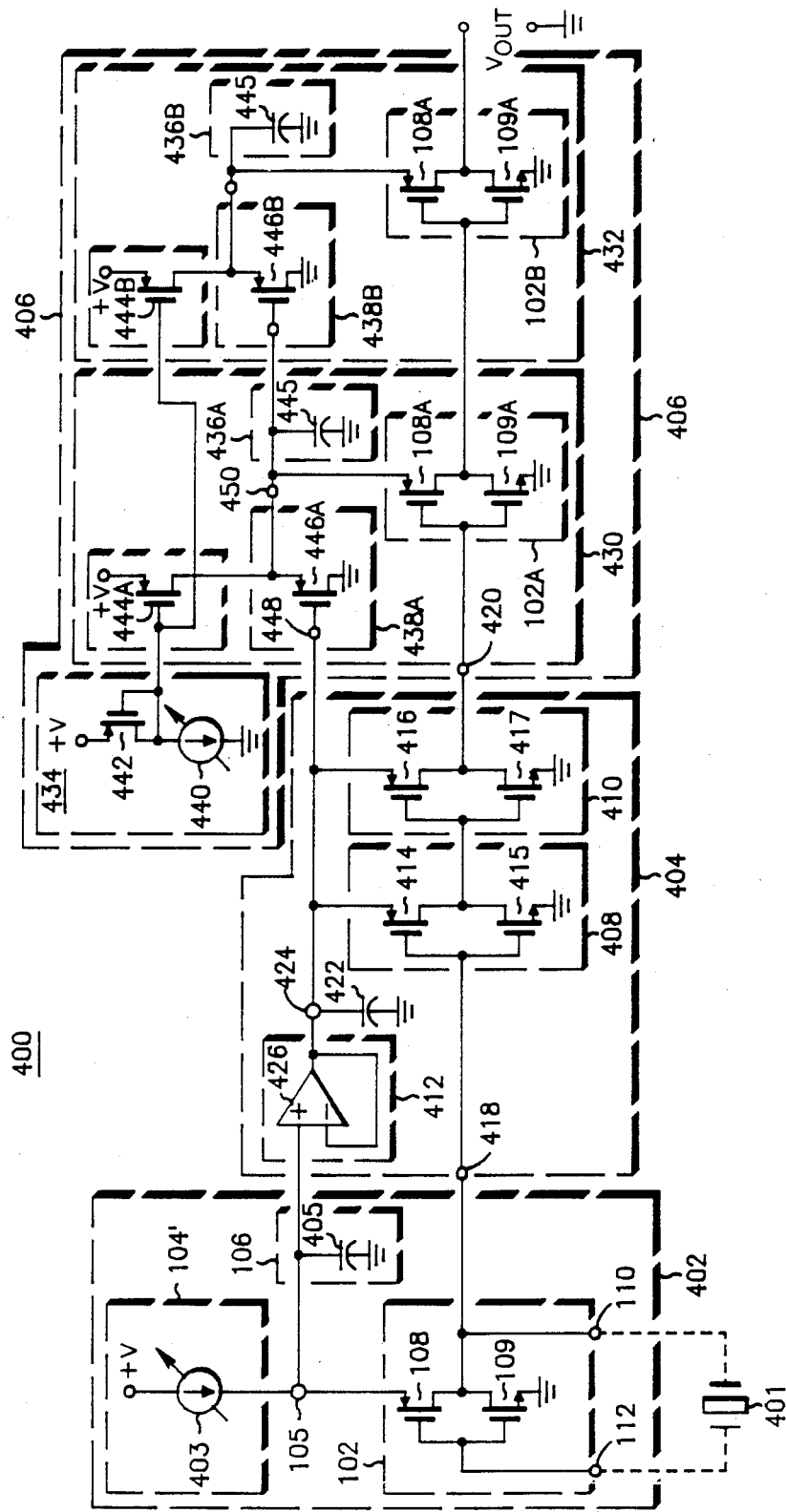
FIG. 4 is a schematic diagram of a low current squaring translator circuit that is useful for squaring and then translating an internally generated sinusoidal signal to a square wave output signal while preserving an associated duty cycle thereof.

FIG. 4 depicts a schematic diagram at 400 of a low current oscillator and translator arrangement that incorporates most aspects of the present invention when coupled to an external crystal (401). This arrangement includes a low current inverter (402), a squaring stage (404), and a low current translator (406).

The low current inverter (402) includes a current source that is programmable (104') for supplying an inverting gain stage (102) via a supply node (105) that has a capacitor (106) of about 15 pF, represented by capacitor 405.

The squaring stage (404) includes a pair of squaring inverters (408, 410) and a supply buffer stage (412) that utilizes the voltage developed at node 105 for the low current inverter to bias the squaring inverters. The squaring inverters are made up of complementary pairs (414-415, and 416-417) that couple to the low current inverter at node 418 and to the low current translator at node 420. This stage generates a square wave that has fast rise and fall times prior to level shifting in the low current translator (406). Since the squaring inverters are DC coupled and biased class AB, the physical gate area and W/L ratio of the devices used in the squaring inverters can be made quite large to provide a large signal low noise output at a very low current. At 20 Mhz, the squaring stage (404) consumes 40 uA. Since the output has fast rise and fall times, it has a low sensitivity to noise and, therefore, minimally sized current efficient devices can be used in the following voltage translator stages.

The physical size of the first squaring inverter is most important since its input signal level is significantly less than that of any of the following stages. The output of the first squaring inverter is not part of the resonant loop and, therefore, is not filtered, whereas the output of the low current inverter (402) is filtered. In the preferred embodiment, the W/L ratios for the P and N channel devices used in the first squaring inverter are 150/3 and 180/9, respectively The supply buffer (412) has its output coupled to a capacitor (422) at a second supply node (424). Supply buffer 412 comprises a voltage follower, such as an operational amplifier connected as shown, that ensures that the voltage supplied to the squaring inverters is approximately the same as the voltage for the low current inverter.

The low current translator (406) includes one or more translator stages (430,432) biased from a common source (434) that programs the current to the pairs of complementary devices represented at 102A and 102B.

The voltage supply represented by 434 includes a programmable current source (440) and a load device (442) to develop the proper bias voltage at devices 444A and 444B to mirror the programmed current to translator stages 430 and 432.

The capacitor (436A) is an integrated capacitance (445) of about 5 picofarads.

The voltage clamp (438A) is shown as a P-channel device (446A) that utilizes the second supply voltage available at its input node 448 and establishes an upper limit voltage at its output node 450.

Subsequently cascaded translator stages, such as stage 432, are coupled as shown, and include a device 444B to mirror the current programmed in 434 to inverting stage 102B, capacitor 436B, and voltage clamp 438B. Each of these stages is similar to translator stage 430, although the supply (434) will preferably be set to a current, I, slightly greater than $I_{opt}$ to allow for a range of input signal levels and for mismatch between stages to ensure a voltage shift of at least $V_t$ per stage.

These translator stages (430,432) incorporate three key design considerations to help preserve duty cycle, including:

1. In inverter stage 102, the ratio of device geometry widths for the P-channel devices versus the N-channel devices is chosen to be less than the ratio typically used to achieve a switching threshold of one-half the inverting stage supply voltage (Vdd/2) so that the switching threshold is skewed downward by a desired amount, about ($\frac{1}{2}$) of a P-channel threshold voltage.

2. The rise and fall times of the input signal are made as fast as possible (as in the squaring inverter stages) before level shifting in the low current translator.

3. When the low current translator includes cascaded inverting stages as translating stages, these stages are designed such that should the duty-cycle skew in a given stage, it will skew back in the opposite sense by the following stage.

In this way the low current CMOS translator, or level shifter, is able to maintain a precise duty cycle output signal.

As a result, each of the above arrangements is able to overcome the limitations of the known art. And, even though the above embodiments fully disclose many of the intended advantages of the present invention, it is to be understood that various changes and modifications not depicted herein are apparent to those skilled in the art.

We claim:

1. A low current translator, for translating a square wave input signal having a first voltage range to a translated square wave output signal having a second voltage range while preserving a duty cycle associated with said input signal, comprising:

(a) at least one inverting stage means, each one for providing an output signal at a second voltage range which is an inverted and translated version of a square wave input signal at a first voltage range applied thereto;

(b) current supplying means for supplying current to each of said inverting stage means;

(c) at least one capacitor means, each one coupled to a respective one of said inverting stage means, as well as to said current supplying means, for storing and developing a supply voltage for a respective one of said inverting stage means; and (d) voltage clamping means, coupled to said at least one inverting stage means, said current supplying means and to said at least one capacitor means as well as to each of a second supply voltage for clamping said input signal to a second voltage range limited by said second supply voltage.

2. A low current translator, for translating a square wave input signal having a first voltage range to a translated square wave output signal having a second voltage range while preserving a duty cycle associated with said input signal, comprising:

(a) a plurality of cascaded inverting stage means, each for providing an output signal at a second voltage range which is an inverted and translated version of an input signal at a first voltage range applied thereto;

(b) current supplying means for supplying current to each of said plurality of cascaded inverting stage means;

(c) a plurality of capacitor means, each one coupled to a respective one of said plurality of inverting stage means, as well as to said current supplying means, of storing and developing a supply voltage for a second voltage range for a respective one of said inverting stage means; and (d) at least one voltage clamping means, coupled to at least one of said plurality of cascaded inverting stage means, for clamping said input signal to a second supply voltage that corresponds to said second voltage range.

3. A low current, squaring translator means, for squaring and then translating an internally generated sinusoidal signal to provide a translated square wave output signal, comprising:

(a) low current inverting means for providing an inverting gain stage for generating a sinusoidal signal coupled to an included first current supplying means and first capacitor means for developing a first supply voltage therein;

(b) squaring means coupled to said low current inverting means and having a first internal supply node that couples to an included first capacitor means, said squaring means for squaring said sinusoidal signal to establish a square wave signal that exhibits a precise duty cycle with low noise; and (c) low current translating means for translating said square wave signal coupled thereto, to provide a translated square wave output signal to maintain a precise duty cycle with low noise.

4. The low current squaring translator means according to claim 3, wherein said inverting stage means is coupled to a crystal and said first capacitor means comprises a capacitor of about 15 picofarads.

5. The low current squaring translator means according to claim 3, wherein said low current inverting means is constructed and arranged for use with a crystal to generate a sinusoidal signal.

6. The low current squaring translator means according to claim 5, including a programmable current source that supplies a level of current between about 30-300 ampers when operating at 10-20 MHz.

7. The low current squaring translator means according to claim 3, wherein said first current supplying means comprises a programmable current source.

8. A low current squaring translator means according to claim 3, wherein said first capacitor of said squaring means comprises a capacitor of at least 5 picofarads coupled to said first supply node.

9. The low current squaring translator means according to claim 3, wherein said squaring means comprises:
(b1) a first squaring inverter for squaring a first signal to provide an intermediate signal;
(b2) a second squaring inverter coupled to said first squaring inverter, for squaring said intermediate signal to provide a square wave output signal; and
(b3) supply buffer means coupled to said first supply node of said low current inverting means, for supplying a buffered supply voltage to said first supply node of said squaring means that couples to said first and second squaring inverters.

10. The low current squaring translator means according to claim 9, wherein said first and said second squaring means each comprise a pair of complementary CMOS devices.

11. The low current squaring translator means according to claim 9, wherein said supply buffer means comprises a voltage follower.

12. The low current squaring translator means according to claim 3, wherein said low current translating means comprises:
(c1) a plurality of cascaded inverting stages;
(c2) a current source coupled to said plurality of cascaded inverting stages;
(c3) a plurality of capacitors, each one coupled to a respective one of said plurality of cascaded inverting stages; and
(c4) at least one voltage clamp coupled to at least one of said plurality of cascaded inverting stages.

13. The low current squaring translator means according to claim 12, wherein said plurality of cascaded inverting stages includes at least a first inverting stage and a second inverting stage, such that any skew in duty cycle exhibited by said first inverting stage is negated by said second inverting stage.

14. A low current translating means, for translating a square wave input signal having a first voltage range to a translated square wave output signal having a second voltage range while preserving a duty cycle associated with said input signal, comprising:
(a) at least one inverting stage means, each one for providing an output signal which is an inverted and translated version of a square wave input signal applied thereto;
(b) current supplying means for supplying current to each of said inverting stage means; and
(c) at least one capacitor means, each one coupled to a respective one of said inverting stage means, as well as to said current said supplying means, for storing and developing a supply voltage for a respective one of said inverting stage means.

15. The low current translating means according to claim 14, wherein said inverting stage means comprises a pair of complimentary CMOS devices.

16. The low current translating means according to claim 14, wherein said current supplying means supplies a fixed amount of current.

17. The low current translating means according to claim 14, wherein said current supplying means supplies a constant current fixed to a level between 3.0-13.5 microamperes when operating at 10-20 megahertz.

18. The low current translating means according to claim 14, wherein said current supplying means supplies a variable amount of current.

19. The low current translating means according to claim 14, wherein said current supplying means supplies a constant current programmable to a level between about 3.0-13.5 microamperes utilizing a plurality of equal-sized programmable steps.

20. The low current translating means according to claim 14, wherein said at least one capacitor means comprises a capacitor of about 5 picofarads.

* * * * *

UNITED STATES PATENT AND TRADEMARK OFFICE
CERTIFICATE OF CORRECTION

PATENT NO. : 4,982,108

DATED : January 1, 1991

INVENTOR(S) : Lawrence Connell et al.

It is certified that error appears in the above-identified patent and that said Letters Patent is hereby corrected as shown below:

Col. 6, line 18, please delete the words "each of".

Col. 6, line 38, please delete the word "of" and insert thereat —for—.

Signed and Sealed this

Thirtieth Day of June, 1992

*Attest:*

DOUGLAS B. COMER

*Attesting Officer*     *Acting Commissioner of Patents and Trademarks*